(12) United States Patent
Carter, Jr. et al.

(10) Patent No.: US 6,465,274 B2
(45) Date of Patent: Oct. 15, 2002

(54) LEAD FRAME TOOLING DESIGN FOR BLEED BARRIER GROOVE

(75) Inventors: Buford H. Carter, Jr., Richardson; Dennis D. Davis, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/862,009

(22) Filed: May 21, 2001

(65) Prior Publication Data

US 2002/0025598 A1 Feb. 28, 2002

Related U.S. Application Data

(62) Division of application No. 09/643,542, filed on Aug. 22, 2000.

(51) Int. Cl.[7] ............... H01L 21/44; H01L 21/48; H01L 21/50

(52) U.S. Cl. .............. 438/106; 259/666; 259/667; 259/675; 259/685; 438/124

(58) Field of Search ............... 438/106, 124; 257/666, 675, 667, 685, 712, 713

(56) References Cited

U.S. PATENT DOCUMENTS

| | | | | |
|---|---|---|---|---|
| 5,557,144 A | * | 9/1996 | Rosenstock et al. | 257/668 |
| 6,001,672 A | * | 12/1999 | Wensel | 438/124 |
| 6,058,602 A | * | 5/2000 | Fehr | 29/827 |
| 6,249,050 B1 | * | 6/2001 | Wensel | 257/712 |

* cited by examiner

Primary Examiner—David Nelms
Assistant Examiner—Reneé R Berry
(74) Attorney, Agent, or Firm—W. Daniel Swayze, Jr.; W. James Brady; Frederick J. Telecky, Jr.

(57) ABSTRACT

An apparatus for forming a stamped groove in a lead frame including a tool for coining the groove in the lead frame. The tool has a shoulder to control swelling of the lead frame surface near the groove.

5 Claims, 5 Drawing Sheets

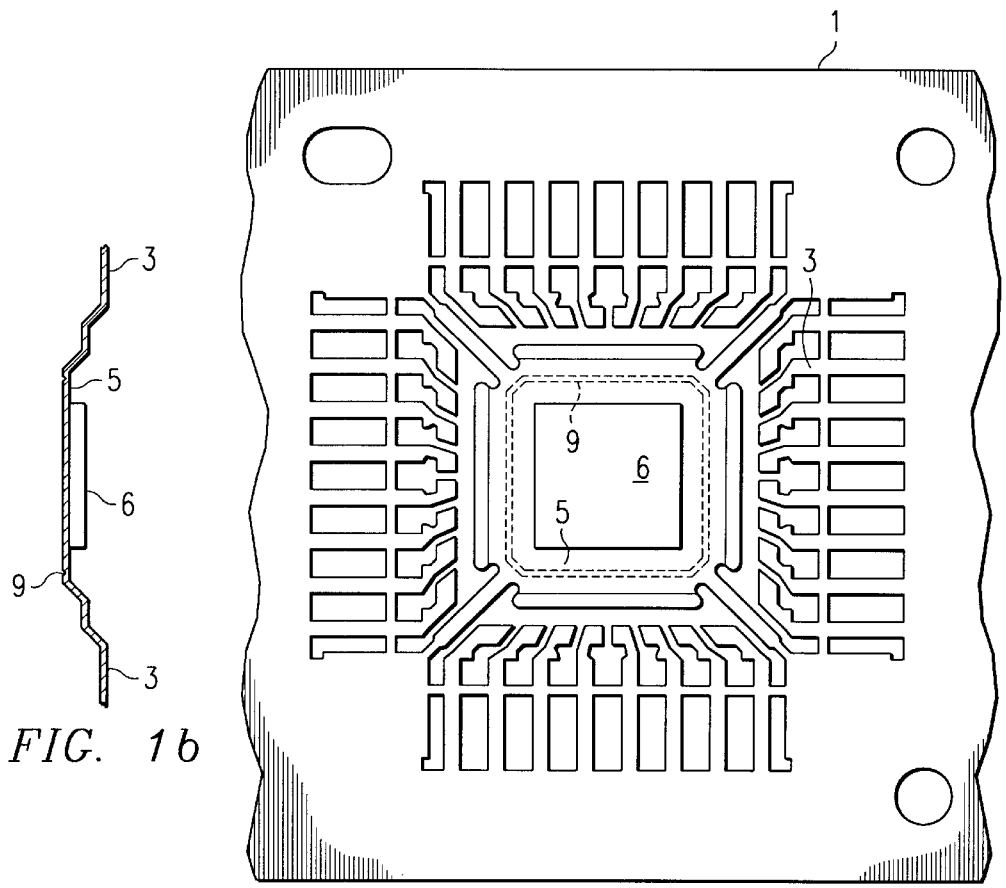
FIG. 1b
FIG. 1a
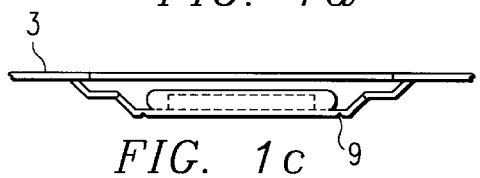
FIG. 1c
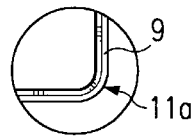
FIG. 1d
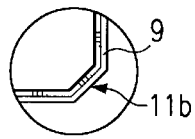
FIG. 1e
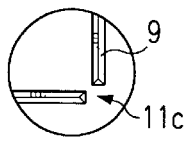
FIG. 1f
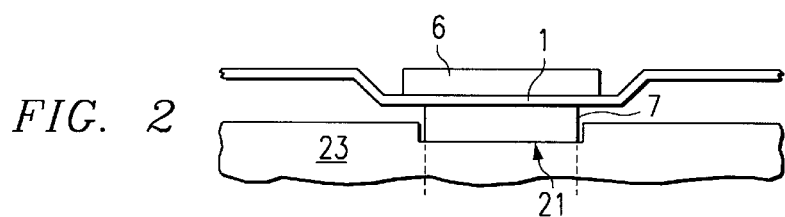
FIG. 2

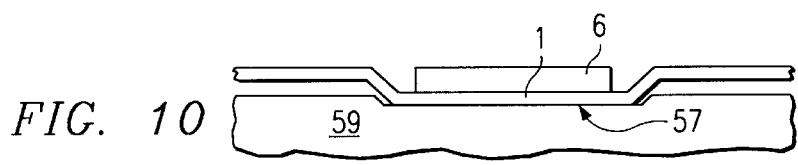
FIG. 10
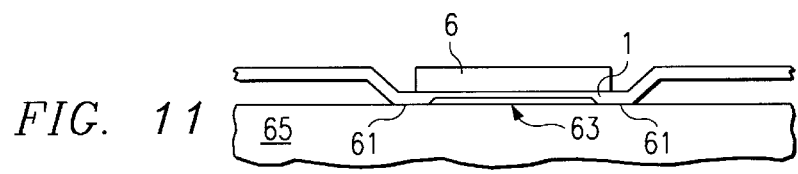
FIG. 11
FIG. 12a
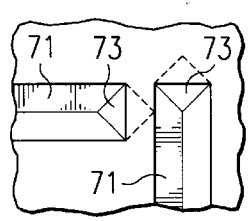
FIG. 13a
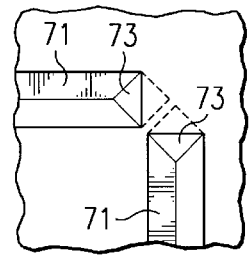
FIG. 13b
FIG. 12b
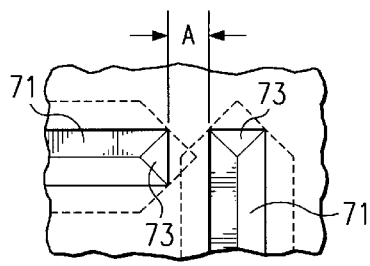
FIG. 13c
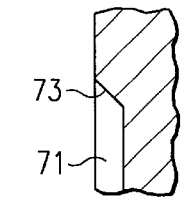
FIG. 13d
FIG. 12c
FIG. 12d
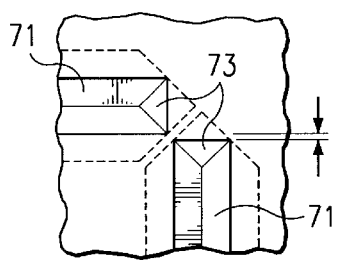
FIG. 13e
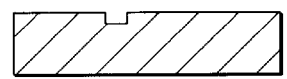
FIG. 12e

LEAD FRAME TOOLING DESIGN FOR BLEED BARRIER GROOVE

This application is a division of Ser. No. 09/643,542, filed Aug. 22, 2000.

FIELD OF THE INVENTION

The present invention relates to a method for stamp tooling bleed barrier grooves in thin material for preventing bleed of encapsulant over an integrated circuit exposed pad or slug for utilization as a heat sink.

BACKGROUND OF THE INVENTION

In the fabrication of integrated circuits, it is often necessary to provide an exposed thermal pad or slug of highly thermally conductive material, such as, for example, copper, which is an integral part of or attached to a lead frame in order to conduct heat away from the semiconductor chip attached to the lead frame. The preferred finish for an exposed pad lead frame is palladium so as to avoid any wet process steps. The purpose of the palladium coating, when used, is set forth in Ser. No. 08/190,729, the contents of which are incorporated herein by reference. The exposed thermal pad is generally defined as the surface of the lead frame opposed to and adjacent to the semiconductor chip. It should be understood that, as an alternative, the lead frame can be made thicker in the region of the thermal pad or with an attached thermal slug. A portion of the processing operation involves encapsulation of the chip and lead frame. This operation requires that the thermal pad be exposed to the external environment in order to allow for maximum dissipation of heat from the semiconductor chip to the external environment through the thermal pad. During encapsulation, the pad is disposed against the mold surface, preferably under compression against the mold surface, to minimize the likelihood of encapsulant traveling between the mold surface and the thermal pad and thereby over the thermal pad surface.

A problem may arise during the encapsulation as described above if the lead frame encapsulation is not flat to the edges or if the compression of the thermal slug against the mold surface is insufficient to prevent mold bleed wherein the molding material not only encapsulates the lead frame and semiconductor chip, but the molding material also passes over and forms a thin, generally transparent coating over the thermal pad. This coating of encapsulant over the thermal pad reduces the thermal performance of the thermal pad by reducing the exposed pad area. The encapsulant coating over the thermal pad also prevents or reduces the ability to bond or solder to the external thermal sink. In addition, irregular mold bleed makes it difficult to specify manufacturing limits and causes a problem during quality control to judge acceptable and unacceptable criteria. Uncontrolled mold bleed is also a cosmetic defect that may result in unacceptability of an otherwise good product.

In the prior art, this mold bleed has generally been removed by abrading or by chemical action of some type. The abrading or chemical action step involves an economic cost in that the abrading and/or chemical action step must be added. In addition, the abrading and/or chemical action step may damage, contaminate or cause removal of all or part of the palladium coating over the lead frame, thereby minimizing or eliminating the beneficial effects derived from the palladium coating.

SUMMARY OF THE INVENTION

In accordance with the present invention, the above described problems of the prior art are minimized if not eliminated.

Briefly, the above is accomplished by providing a barrier to the encapsulant travel over the thermal pad during device encapsulation. This is accomplished in several ways in accordance with the present invention. In accordance with one group of embodiments of the invention, a groove or grooves of various possible shapes are formed in the lead frame itself by stamping, etching or the like. The groove surrounds all or part of the thermal pad so that any encapsulant traveling toward the center of the thermal pad freezes at the entrance to the groove and therefore acts as a block to the travel of encapsulant over the thermal pad. In some cases, the encapsulant may fill the groove and travels no further. As a second group of embodiments, the groove or grooves can be formed in the mold. As a third group of embodiments, ridges can be placed in the mold to prevent the movement of the encapsulant over the exposed surface of the thermal pad. As a fourth group of embodiments, ridges can be formed on the lead frame surface. In the case of the grooves, the encapsulant is either trapped in the grooves or freezes when entering a groove to inhibit further travel of encapsulant over the thermal pad surface. In the case of the ridges, the ridges rest against the surface of the mold, generally but not necessarily under compression, to act as a barrier to the travel of the encapsulant beyond the ridges and over the surface of the thermal pad. The action is the same as the groove but reversed in implementation.

In those instances wherein the features of the grooves are stamped into the lead frame, there can be swelling due to displaced material along the length of the groove and where the grooves meet at a corner. Greater swelling at corner intersections results in a failure to maintain the lead frame flat with the mold and permits encapsulant to travel to the thermal pad via longer straight line regions. The solution for stamped grooves was to pattern ends of grooves short of the corner or groove line segment such that swelling by displaced groove material created an effective swelling equivalent to the swelling of the straight line segments (see FIGS. 13, 13a, 13b and 14). Etched grooves do not introduce any swelling and can easily be patterned for any shape. However, etched grooves typically have a prohibitive cost for high volume.

Additionally, it is necessary to have a tool that is capable of forming the groove. The groove should be of sufficient depth to trap or freeze the encapsulant in the groove. The tool should be designed so as to control swelling of the thermal pad as the groove is being formed.

The grooves can take various shapes, examples of these shapes being "V," check, sawtooth, square and rectangular, as well as a concave cup in the case of etching. The grooves will generally have a depth equal to about half of their lead frame material thickness. A minimum groove depth of about 1.5 to 2.5 mils can provide a suitable barrier to the encapsulant.

As a result of the subject invention, bleed control is provided by design into the lead frame or mold to provide lower cost and higher assembly throughout than is obtained by the prior art chemical deflash, mechanical deflash, liquid or tape masking or the pad/slug and by use of tape, chemical or special materials in the package mold.

The present invention requires no chemicals, wet processing or added plating cost. In addition, no processing is required which will degrade package reliability, and no additional assembly processes or materials are required. The palladium solderable finish, when used, is preserved over the lead frame, and the groove provides better ability for quality control inspection for mold bleed.

BRIEF DESCRIPTION OF THE DRAWINGS

FIG. 1a is a view of the surface of a lead frame containing a groove in accordance with the present invention;

FIG. 1b is a cross-section view taken through the center of the die mounted onto the lead frame in FIG. 1a;

FIG. 1c is a side view of the lead frame of FIG. 1a;

FIG. 1d is an enlarged view of a groove corner having a rounded geometry in accordance with the present invention;

FIG. 1e is an enlarged view of a groove corner having a chamfered geometry in accordance with the present invention;

FIG. 1f is an enlarged view of a groove corner having open corner geometry in accordance with the present invention;

FIGS. 2 to 11 show various embodiments in accordance with the present invention;

FIG. 12a shows an etched groove cross-section;

FIGS. 12b to 12e show various stamp groove configurations;

FIGS. 13a to 13e show design techniques for matching swelling of stamped groove junctures and line segments;

DETAILED DESCRIPTION OF THE PRESENT INVENTION

Figure 3:
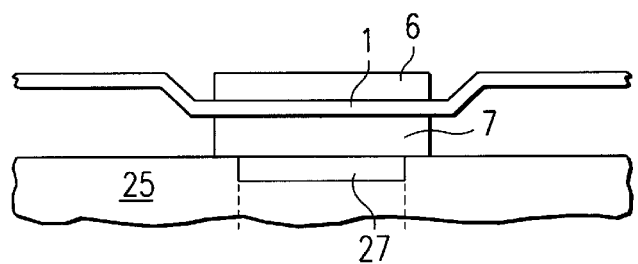

Referring first to FIG. 1a, there is shown a lead frame 1 having a plurality of lead fingers 3 and a thermal pad region 5 which contains one of a thermal pad (better shown in FIGS. 1b and 1c). A semiconductor chip or die 6, shown in FIGS. 1a and 1b, will be positioned over the thermal pad 5. A groove 9 (on the opposite side of the lead frame from the die) surrounds a major portion of the thermal pad 5. The stamp groove may have radius corners 11a, chamfered corners 11b, or open corners 11c, shown in FIGS. 1d, 1e and 1f, which are designs to avoid the build-up of lead frame material at the corners during groove formation. The groove 9 can take any one of several shapes as shown in FIG. 12. A V-shaped groove with a chamfered groove corner is shown in FIG. 1f as an example.

In order to fabricate a semiconductor device, the lead frame of FIGS. 1a to 1c is provided with a semiconductor chip disposed over the thermal pad 5. The chip 6 is bonded to the top of the lead frame thermal pad 5, and the groove 9 is disposed on the opposite side of the lead frame from the chip, and the, thermal pad remains exposed after molding is completed (encapsulation with plastic).

FIGS. 2 to 5 show lead frames with a thermal slug or dual thickness lead frames.

Referring to FIG. 2, there is shown a lead frame 1 having a thermal slug 7 secured thereto. The thermal slug 7 is disposed in a cavity 21 in a mold 23 with a space being provided between the sides of the cavity 21 and the thermal slug 7. A chip 6 is secured to the lead frame 1 on the lead frame surface opposed to the slug 7 and directly adjacent to or over the slug. During encapsulation, the encapsulant will travel into the cavity and freeze in the cavity region between, the slug 7 and the cavity side wall. This will prevent the further travel of encapsulant over the surface of the thermal slug 7.

Referring to FIG. 3, there is shown the same lead frame 1 and thermal slug 7 as shown in FIG. 2. The mold 25 has a cavity 27 with the thermal slug 7 resting over the cavity. During encapsulation, the encapsulant will travel into the cavity 27 and freeze as it enters the cavity, assuming that the cavity is not filled with encapsulant. In this case, some encapsulant may remain in the cavity 27 when the encapsulated device is removed from the mold.

Figure 4:
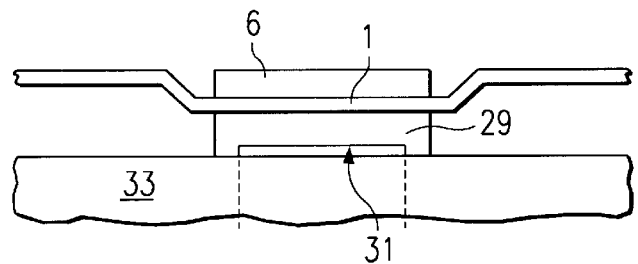

Referring to FIG. 4, there is shown the same lead frame 1; however, the thermal slug 29 has been altered to have a cavity 31, the edges of the cavity contacting the mold 33. The perimeter of the cavity 31 acts as a barrier to the movement of the encapsulant into the cavity.

Figure 5:
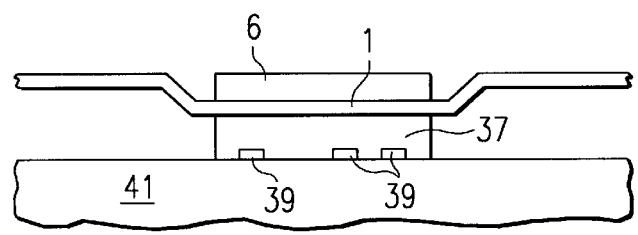

Referring to FIG. 5, there is shown the same lead frame 1; however, the thermal slug 37 has been provided with one or a plurality of grooves 39 of the type discussed above with reference to FIGS. 12a to 12e. The grooves 39 contact the mold 41. During encapsulation, any encapsulant which travels between the mold 41 and the slug 37 is trapped in a groove 39 which surrounds the slug. One or two grooves can be used, this Figure showing both possibilities in part.

FIGS. 6 to 11 show single-piece deep downset thermal pad lead frames (POWER PAD™) with grooves.

Figure 6:
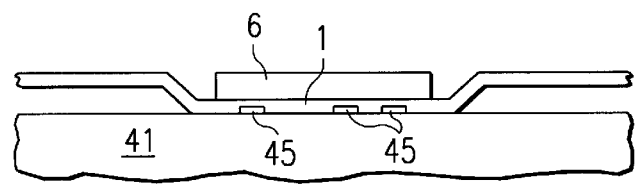

Referring to FIG. 6, there is shown lead frame 1 with grooves 45 in the lead frame. The grooves 45 operate against the mold 41 in the same manner as discussed above with reference to FIG. 5.

Figure 7:
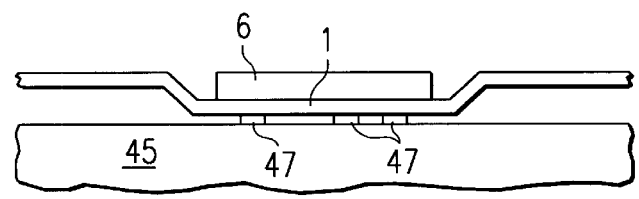

Referring to FIG. 7, there is shown a lead frame 1 wherein ridges 47 are disposed in the mold 45. Fabrication takes place in the same manner as discussed above with reference to FIG. 4.

Figure 8:
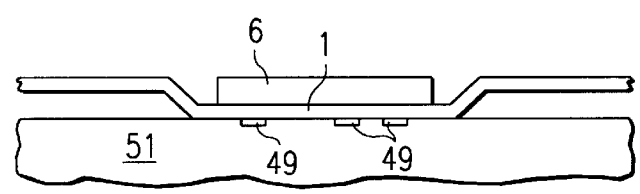

Referring to FIG. 8, there is shown a lead frame 1 wherein the grooves 49 are disposed in the mold 51. Fabrication takes place in the same manner as discussed above with reference to FIGS. 5 or 6.

Figure 9:
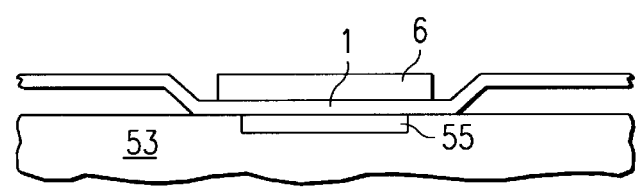

Referring to FIG. 9, there is shown a lead frame 1 with the thermal pad resting over a cavity 55 in the mold 53. Fabrication takes place in the same manner as discussed above with reference to FIG. 3.

Referring to FIG. 10, there is shown a lead frame 1 with the thermal pad resting within a cavity 57 in the mold 59. Fabrication takes place in the same manner as set forth above with reference to FIG. 2.

Referring to FIG. 11, there is shown a lead frame 1 with ridges 61 in the lead frame forming a cavity 63 between the lead frame, the ridges and the mold 65. Fabrication takes place in the same manner as set forth above with reference to FIG. 4.

It should be understood that, in all cases wherein an exposed thermal pad lead frame is discussed, this can be replaced with a thermal slug or thickened lead frame. Also, all grooves can have any of the above discussed shapes as well as many other shapes, the stamped "V" shape and etched groove being the easiest to fabricate.

Referring to FIGS. 12a to 12e, there are shown typical groove shapes that can be used, FIG. 12a showing a cup-shaped groove obtained by etching. Etched grooves offer great flexibility in a groove flat pattern. The depth and width of the groove are controlled through the photo tool artwork.

Shapes obtainable by stamping are shown in FIGS. 12b to 12e with FIG. 12b showing a V-shaped groove, FIG. 12c showing a check-shaped groove, FIG. 12d showing a sawtooth-shaped groove, and FIG. 12e showing a square-shaped groove. The sharp square or sawtooth groove is preferred; however, the "V" is the easiest to implement. The balanced "V" groove swells equally on both sides of the groove.

FIGS. 13a to 13e show design techniques for matching swelling of stamped groove junctures 73 and line segments 71. During design, the groove swelling is projected, and the location of the adjoining grooves 71 is set so that the projected swelling at junctures 73 is equal to that for the longer line segments. The grooves at the ends of the line segments 73 are angled to achieve the desired uniform projected swelling. By building the stamped groove in the line segment, the tooling is made much easier to fabricate and accommodate design changes.

Figures 14A, 14B:
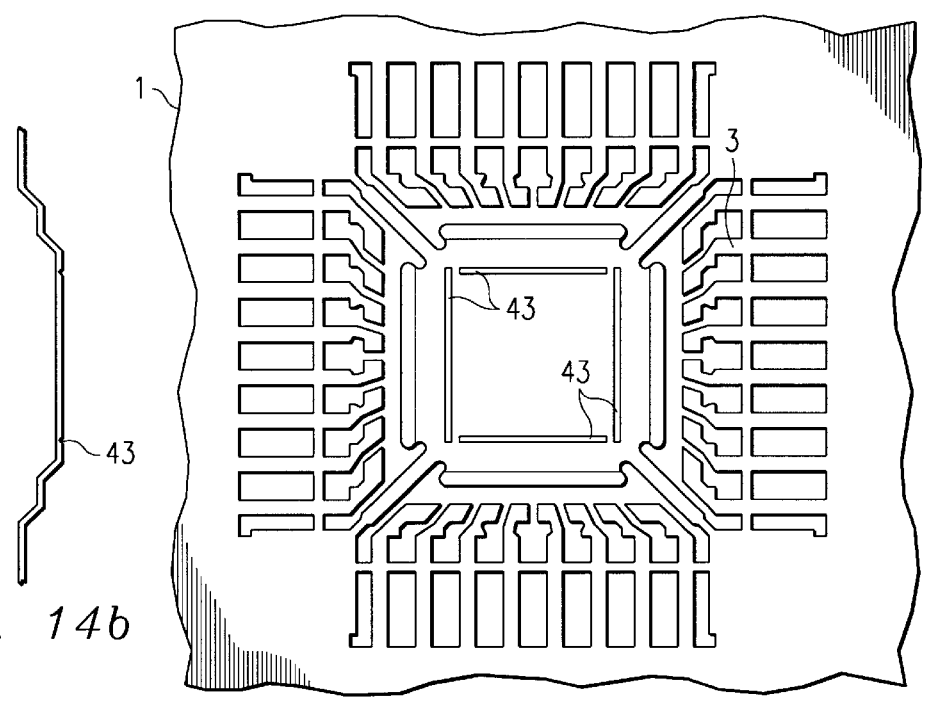
FIG. 14 shows the implementation of stamped bleed barrier grooves that provide simple, flexible, economical groove tooling and uniform swelling of line segments and junctures.

FIG. 14 shows the implementation of "stamped" bleed barrier grooves 43 to provide simple, flexible, economical groove tooling and uniform swelling of line segments and junctures. This is a good high-volume production design that allows the groove segments to sharply follow contour where bleed protection has been determined to be needed.

Figures 15A, 15B:
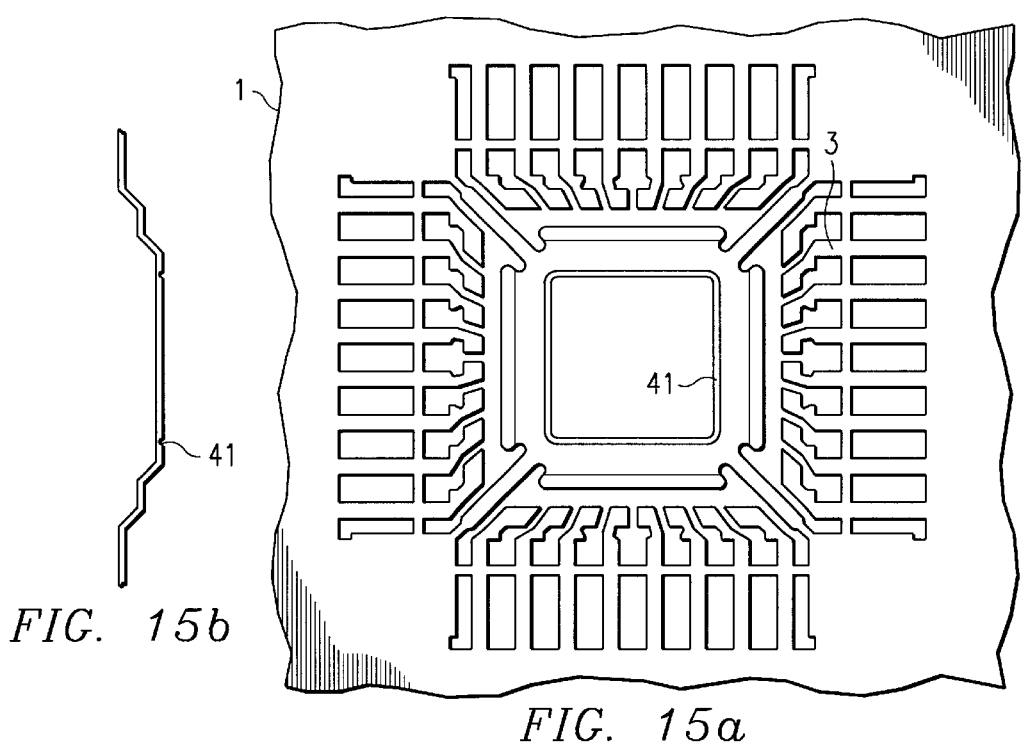
FIGS. 15a and 15b show top and cross-sectional view of the implementation of etched bleed barrier grooves in a HTQFP package.

FIG. 15 shows the implementation of "etched" bleed barrier grooves 41 in a HTQFP package. The groove pattern is placed in the etch lead frame artwork and, hence, results in no added cost or process steps.

Figure 16:
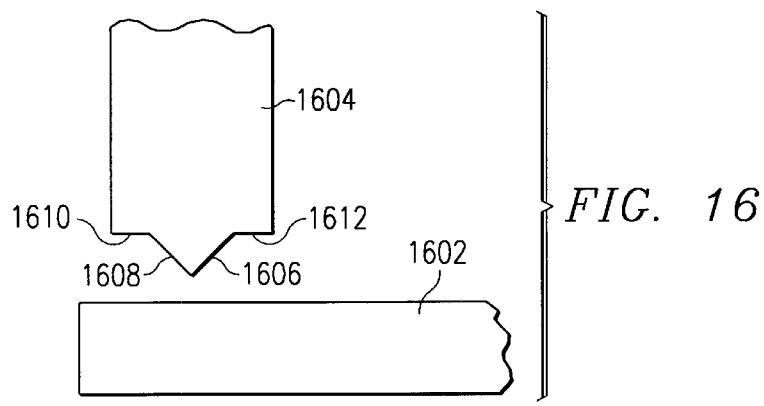
FIG. 16 illustrates a tool to create a stamped "V" groove in accordance with the present invention.

FIG. 16 illustrates the tool 1604 in accordance with the teachings of the present invention. The tool 1604 is used to stamp a groove into the lead frame 1602 or, more particularly, the thermal pad of the lead frame 1602. The lead frame is illustrated as element 1602. Additionally, the lead frame 1602 could be a thermal slug. The tool 1604 includes edges 1608 and 1606. These edges 1608 and 1606 form a V-shaped member which is used to form a groove within lead frame 1602. Additionally, the tool 1604 includes shoulder 1610 and shoulder 1612 which are adjacent to edges 1608 and 1606. These shoulders 1610 and 1612 are used to coin swelling of lead frame 1602.

Figure 19:
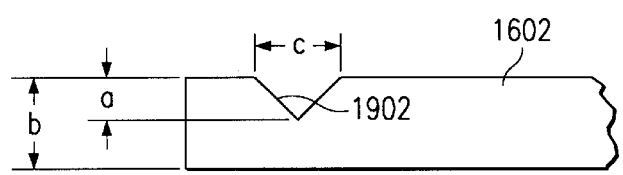
FIG. 19 illustrates the effect of the tool of FIG. 16 being used.

FIG. 19 illustrates a lead frame 1602 after it has had a groove formed within it. The groove 1902 is substantially V-shaped. Typically, lead frames that have a thickness of 8 to 10 mils (b) have a groove depth of approximately 2.5 to 4 mils (a) while lead frames that have a thickness of 5 to 6 mils (b) having a groove depth of approximately 1.5 to 2.5 mils (a).

The width of the groove at the surface of the lead frame is 3.0 to 8.0 mils (c). A value of 3 mils minimum for (c) is sufficient to prevent the material from jumping across the groove, which otherwise would prevent the groove from functioning as a barrier.

Figure 17A:
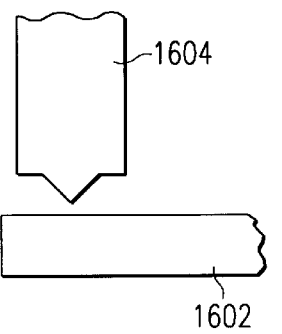
FIG. 17 illustrates the tool being used.
Figure 17B:
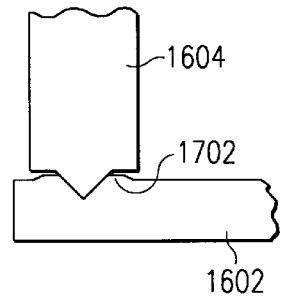
Figure 17C:
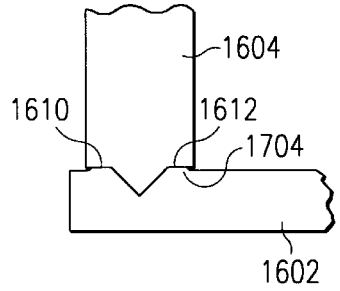

FIG. 17 illustrates the operation of tool 1604 of the present invention. FIG. 17a illustrates the tool positioned above lead frame 1602. FIG. 17b illustrates the tool 1604 penetrating the lead frame 1602. As a consequence of the penetration of tool 1604 into lead frame 1602, swell 1702 occurs. FIG. 17c illustrates that the swell 1704 is reduced due to the coining of the tool 1610 and 1612 onto the lead frame. Swell 1702 is flattened to uniform height.

FIG. 18 illustrates another tool 1804 used to create a different shape groove, for example a square or rectangle shaped groove, into lead frame 1802. The tool 1804 has a rectangular projection 1810. Typically, lead frames that have a thickness of 8 to 10 mils (e) have a groove depth of approximately 2.5 to 4 mils (d) while lead frames that have a thickness of 5 to 6 mils (e) have a groove depth of approximately 1.5 to 2.5 mils (d).

The width of the groove at the surface of the lead frame is 3.0 to 8.0 mils (dd). A value of 3 mils minimum is sufficient to prevent the material from jumping across the groove, which otherwise would prevent the groove from functioning as a barrier.

Figure 18A:
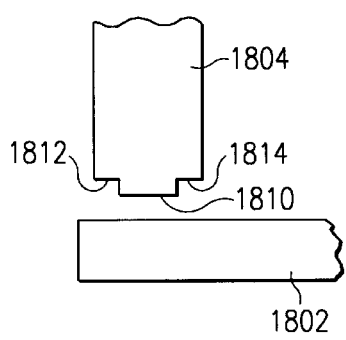
FIG. 18 illustrates another tool being used to create a stamped "square" or "rectangular" groove in accordance with the present invention.
Figure 18B:
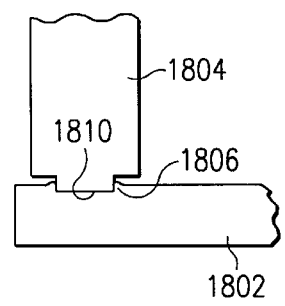
Figure 18C:
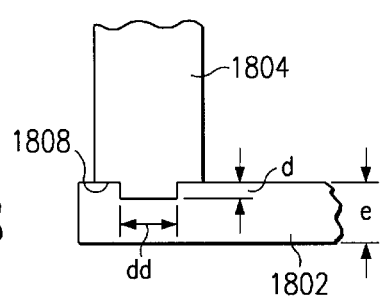

Similar to shoulders 1610 and 1612, the shoulder 1812 and shoulder 1814 are used to coin the lead frame swell 1806. In operation, FIG. 18a illustrates the tool 1804 positioned above the lead frame 1802. The tool 1804 moves downward to penetrate the surface of lead frame 1802. FIG. 18b illustrates the tool 1804 penetrating the lead frame 1802. Swelling 1806 occurs around the protrusion 1810. FIG. 18c illustrates that the tool 1804 has made a square groove and coined the lead frame swell 1806.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of minimizing bleeding of encapsulant in a semiconductor device which comprises the steps of:

providing a lead frame having a region designed for conducting heat from said lead frame to the external environment; providing a mold;

forming an encapsulant barrier for surrounding said region designed for conducting heat;

placing said lead frame within said mold with said encapsulant barrier surrounding said region designed for conducting heat; and incorporating encapsulant into said mold to encapsulate said lead frame, said encapsulant barrier preventing said encapsulant from bleeding over said region within said mold, wherein said encapsulant barrier is one of a groove or ridge at least 1.5 mils deep at the surface of the lead frame on one side of said lead frame.

2. The method of claim 1, wherein said region designed for conducting heat, includes an exposed thermal pad.

3. The method of claim 1, wherein said region is a highly thermally conductive thickened region of said lead frame, a thermal slug, or an exposed single-piece lead frame pad.

4. The method of claim 1, wherein said encapsulant barrier is a groove and wherein said groove has one of rounded or chamfered corners or a swell-controlled abutment.

5. A method of minimizing bleeding of encapsulant in a semiconductor device which comprises the steps of:

providing a lead frame having a region designed for conducting heat from said lead frame to the external environment;

providing a mold;

forming an encapsulant barrier for surrounding said region designed for conducting heat;

placing said lead frame within said mold with said encapsulant barrier surrounding said region designed for conducting heat; and incorporating encapsulant into said mold to encapsulate said lead frame, said encapsulant barrier preventing said encapsulant from bleeding over said region within said mold, wherein said encapsulant barrier is one of a groove or ridge at least 1.5 mils deep at the surface of the lead frame.

* * * * *